(12) United States Patent
Nakamura

(10) Patent No.: US 8,368,569 B2
(45) Date of Patent: Feb. 5, 2013

(54) DATA CONVERTING DEVICE, PROGRAM AND METHOD

(75) Inventor: Masami Nakamura, Tokyo (JP)

(73) Assignee: Kabushiki Kaisha Kenwood, Hachiouji-shi, Tokyo (JP)

( * ) Notice: Subject to any disclaimer, the term of this patent is extended or adjusted under 35 U.S.C. 154(b) by 91 days.

(21) Appl. No.: 12/918,172

(22) PCT Filed: Feb. 20, 2009

(86) PCT No.: PCT/JP2009/052957
§ 371 (c)(1),
(2), (4) Date: Aug. 18, 2010

(87) PCT Pub. No.: WO2009/104710
PCT Pub. Date: Aug. 27, 2009

(65) Prior Publication Data
US 2010/0328114 A1     Dec. 30, 2010

(30) Foreign Application Priority Data
Feb. 21, 2008 (JP) ................... 2008-040699

(51) Int. Cl.
*H03M 1/06* (2006.01)

(52) U.S. Cl. ........ 341/118; 341/110; 341/120; 341/144; 341/155

(58) Field of Classification Search .................. 341/103, 341/104, 118, 120, 143, 144, 155
See application file for complete search history.

(56) References Cited

U.S. PATENT DOCUMENTS 2,560,709 A   7/1951 Woodward
5,331,587 A   7/1994 Abel et al.

(Continued)

FOREIGN PATENT DOCUMENTS

DE   10 2004 043594   3/2006
EP       1 172 935   1/2002

(Continued)

OTHER PUBLICATIONS

Notification of Transmittal of Translation of the International Preliminary Report on Patentability (Application No. PCT/JP2009/052957) dated Oct. 14, 2010.

(Continued)

*Primary Examiner* — Linh Nguyen
(74) *Attorney, Agent, or Firm* — Eric J. Robinson; Robinson Intellectual Property Law Office, P.C.

(57) ABSTRACT

A data conversion device is provided with a data converting means that sequentially converts first data into second data of the number of second bits, wherein an analog signal is quantized into the first data by the number of first bits, and the first and second data can be first and second maximum values, respectively. The data converting means is comprised of a first conversion means (steps 21 and 23) that, when a value of the fast data is not the first maximum value, converts the first data to the second data by adding 0 to a lower bit side of the first data and a second conversion means (steps 21 and 24-26) that converts the first data to the second data so that, when a value of the first data is the fast maximum value, a value can be made larger, in accordance with a value be-fore or after the first data, than the data of the number of second bits obtained by adding 0 to the lower bit side of the first data. With the structure, when the data obtained by quantizing an analog signal is converted to data with the number of more bits, a rounding error by quantizing is improved as much as possible.

11 Claims, 9 Drawing Sheets

U.S. PATENT DOCUMENTS

| | | | |
|---|---|---|---|
| 5,638,070 A * | 6/1997 | Kuwaoka | 341/95 |
| 6,281,824 B1 * | 8/2001 | Masuda | 341/144 |
| 6,304,200 B1 * | 10/2001 | Masuda | 341/144 |
| 6,606,047 B1 * | 8/2003 | Borjesson et al. | 341/155 |
| 6,628,720 B1 * | 9/2003 | Sekii | 375/247 |
| 6,697,688 B1 * | 2/2004 | Kuwaoka | 700/94 |
| 7,194,036 B1 * | 3/2007 | Melanson | 375/247 |
| 7,202,804 B2 * | 4/2007 | Nakagaki et al. | 341/118 |
| 7,365,671 B1 * | 4/2008 | Anderson | 341/155 |
| 2005/0270214 A1 * | 12/2005 | Seknicka | 341/155 |

FOREIGN PATENT DOCUMENTS

| | | |
|---|---|---|
| JP | 08-065106 | 3/1996 |
| JP | 2000-059222 | 2/2000 |
| JP | 2007-166315 | 6/2007 |
| JP | 2007-221569 | 8/2007 |
| KR | 2008-0010941 | 1/2008 |
| WO | WO 99/60704 | 11/1999 |
| WO | WO 2007/069369 | 6/2007 |

OTHER PUBLICATIONS

International Search Report for Application Serial No. PCT/JP2009/052957 dated May 19, 2009.

Supplementary European Search Report (Application No. 09712740.1) dated Oct. 4, 2011.

Fong et al. "Monte Carlo smoothing for non-linearly distorted signals," 2001 IEEE International Conference on acoustics, speech, and signal processing.(ICASSP). Salt Lake City, UT, May 7-11, 2001; [IEEE International Conference on acoustics, speech, and signal processing (ICASSP)], New York, NY; IEEE, US, vol. 6, May 7, 2001, pp. 3997-4000.

Official Action (JP 2008-040699) dated Aug. 14, 2012.

* cited by examiner

FIG. 11
| ORIGINAL VALUE | 16-BIT | 24-BIT |
|---|---|---|
| 1 | 7FFF | 7FFFFF |
| 0.9 | 7333 | 733333 |
| 0.8 | 6666 | 666666 |
| ⋮ | ⋮ | ⋮ |
| 0.2 | 199A | 19999A |
| 0.1 | 0CCD | 0CCCCD |
| 0 | 0000 | 000000 |
| −0.1 | F333 | F33333 |
| −0.2 | E666 | E66666 |
| ⋮ | ⋮ | ⋮ |
| −0.9 | 8CCD | 8CCCCD |
| −1 | 8000 | 800000 |
FIG. 12
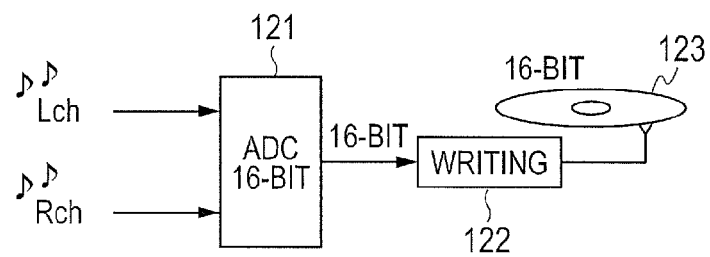
FIG. 13
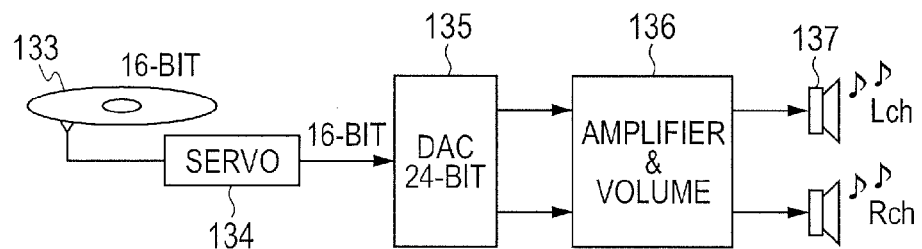

| ORIGINAL VALUE | CD DATA | INPUT DATA (24-BIT) FROM CD FOR USE IN DAC AND DSP |
|---|---|---|
| 1 | 7FFF | 7FFF 00 |
| 0.9 | 7333 | 7333 00 |
| 0.8 | 6666 | 6666 00 |
| ⋮ | ⋮ | ⋮ |
| ⋮ | ⋮ | ⋮ |
| 0.2 | 199A | 199A 00 |
| 0.1 | 0CCD | 0CCD 00 |
| 0 | 0000 | 0000 00 |
| −0.1 | F333 | F333 00 |
| −0.2 | E666 | E666 00 |
| ⋮ | ⋮ | ⋮ |
| ⋮ | ⋮ | ⋮ |
| −0.9 | 8CCD | 8CCD 00 |
| −1 | 8000 | 8000 00 | ns
DATA CONVERTING DEVICE, PROGRAM AND METHOD

TECHNICAL FIELD

The present invention relates to a data converting device for sequentially converting data of a first number of bits into data of a second number of bits which is greater than the first number of bits, a data converting program for causing a computer to function as the data converting device, and a data converting method for the data converting device.

BACKGROUND ART

One of conventional standards relating to data recorded on a compact disk (hereafter, a "CD") is based on a sampling frequency of 44.1 [kHz] and a quantization bit rate of 16 bits. Thus, the size of digital data for a CD or the like is represented using 16-bit representations corresponding to the values of 1 through −1. That is to say, encoding is carried out by dividing the values of 1 to −1 by the number of values that can be represented by the quantization bit rate and determining 16-bit numerical values corresponding to the individual values resulting from division. Quantization for a CD is performed by dividing the values of 1 to −1 with the accuracy of the 15th power of 2 excluding a sign bit. That is to say, in general, 16-bit values from 0x7FFF to 0x8000 are related to the original values of 1 to −1 as shown in FIG. 11. When the quantization bit rate is 24-bit, 0x7FFFFF to 0x800000 correspond to 1 to −1, as also shown in FIG. 11.

FIG. 12 shows a configuration of a recording device for recording on a CD. As shown in the figure, to record on a CD 123, audio signals for right and left channels are converted to 16-bit digital signals by a 16-bit A/D converter 121. The digital signals are written on the CD 123 by writing means 122. When a maximum voltage that can be input to the A/D converter 121 is denoted as $V_{dd}$ and an input voltage on the A/D converter 121 associated with an analog audio signal is denoted as $V_{in}$ as shown in FIG. 15, a voltage corresponding to 16-bit 0x0001 is a value obtained by dividing $V_{dd}$ by the 15th power of 2, and $V_{in}$ is represented by a multiple of that value. In other words, the A/D converter 121 encodes an analog audio signal input thereto according to the equation below to convert it into a 16-bit digital signal. In the process, a small variation in voltage below a voltage equal to $V_{dd}$ divided by the 15th power of 2 will be rounded. Also, when $V_{in}=V_{dd}$, the corresponding value is 0x8000, but because the MSB is a sign bit, the value is rounded to 0x7FFF.
[Formula 1]

Known devices that thus outputs rounded input data include a device described in Patent Document 1, for example. When outputting input data with resolution decreased to a quarter, for example, the device first sets the initial input data as a reference value, then rounds the input data by dividing the data by 4 and dropping or rounding off the remainder, and outputs the resulting data. For subsequent input data having a variation from the reference value smaller than 4, the device does not change output data, i.e., outputs the rounded reference value. When subsequent input data varies from the reference value by 4 or greater, the device replaces the output data with a value obtained by rounding that input data and also updates the reference value to that input data. In short, the device permits change of output data only when a variation equivalent to reduction in resolution is found in input data, thereby ensuring smooth variation in output data.

Patent Document 2 describes a technique for rounding z-bit input data to z/2-bit data. This technique determines which bits to remove for rounding according to bits being used.

FIG. 13 illustrates a basic configuration of a reproducing device for reproducing audio recorded on a CD. For reproduction, an audio signal recorded on CD 133 is read as 16-bit data via a servo mechanism 134 and converted to an analog signal in a 24-bit D/A converter 135. The analog signal passes through an amplifier and volume 136 to drive loudspeakers 137.

Digital Signal Processors (DSP) and D/A converters, which are recent digital-signal processing ICs, have improved bit precision and are mostly 24-bit as the D/A converter 135. To input 16-bit data from the CD 133 to the 24-bit D/A converter 135, it is necessary to convert the 16-bit data to 24-bit data. Accordingly, data from the CD 133 is converted to 24-bit data by using the data from the CD 133 as upper 16-bit data and adding zeros as lower 8 bits to make 24-bit data, as shown in FIG. 14. The figure shows 16-bit CD data corresponding to original values from 1 to −1 as well as 24-bit data after conversion for use in the D/A converter and/or a DSP.

Patent Document 1: Japanese Patent Application Laid-Open No. H05-35258
Patent Document 2: Japanese Patent Application Laid-Open No. 2007-280082

DISCLOSURE OF THE INVENTION

Problems to be Solved by the Invention

As mentioned above, however, when an analog audio signal is represented in 16 bits according to the CD standard, intermediate values that cannot be represented are rounded. At the time of rounding, analog audio signals that correspond to values in the range of 0x7FFD80 to 0x7FFE7F when represented in 24 bits are rounded to 0x7FFE, but analog audio signals in the ranges from 0x7FFE80 to 0x7FFF7F and from 0x7FFF80 to 0x7FFFFF are rounded to 0x7FFF.

That is to say, when rounded to a value that can be represented in 16 bits, a value that is rounded to a value other than 0x7FFF can take a range of 0x0000FF, but the range that a value rounded to 0x7FFF can take is 0x00017F. This means that an error range of rounding to 0x7FFF is larger than that of rounding to other values.

Consequently, when 16-bit data from a CD is converted to 24-bit data by simply adding zeros on the lower-bit side of the data as shown in FIG. 14, a large error range that might be contained in the 0x7FFF data from the CD would be inherited into the 24-bit data as it is. When data from the CD is 0x7FFF, this value is the maximum value that can be represented, thus audio clipping may be occurring. When there is clipping, an error from the original value becomes even larger.

When the data from the CD is 0x8000, data after conversion to 24 bits will be 0x800000, which is the minimum value. Again, there is a problem of a large error range being inherited into the 24-bit data as it is.

In view of such disadvantages of conventional art, an objective of the present invention is to provide a technique capable of improving a rounding error associated with quantization as much as possible when converting data resulting from quantization with a certain quantization bit rate to data of a larger number of bits.

Means for Solving the Problems

To attain the above objective, a data converting device according to a first aspect of the invention includes data converting means for sequentially converting first data obtained by quantization with a first number of bits to second data extended to a second number of bits, the first data and the second data being data that can assume respective maximum values thereof, wherein when a value of the first data is the maximum value, the data converting means converts the first data to the second data such that the second data is set to a value that takes into account the value of first data that precedes or succeeds the first data being converted.

In this configuration, when the value of first data is the maximum value, an average value range that can be assumed by the original analog signal rounded to the first data is, when considered in terms of second data, larger than the value of data of the second number of bits that is obtained by adding zeros on the lower-bit side of the first data. Because the present invention performs conversion so that the second data is set to a value that takes into account the value of first data that precedes or succeeds the first data being converted, the second data can be closer to the original analog signal. That is to say, in conversion to the second data, a rounding error contained in the first data can be improved.

A data converting device according to a second aspect is the data converting device according to the first aspect, wherein when the value of first data pertaining to a present conversion is the maximum value and the value of first data pertaining to a last conversion is not the maximum value, the data converting means performs the present conversion such that the second data is set to a value between a value of the second number of bits that is obtained by adding zeros on a lower-bit side of the maximum value and the maximum value of the second data.

A data converting device according to a third aspect is the data converting device according to the first aspect, wherein when the value of first data pertaining to the present conversion is the maximum value and the value of first data pertaining to the last conversion is not the maximum value, the data converting means performs the present conversion such that the second data is set to a value between a value of the second number of bits that is obtained by adding zeros on the lower-bit side of the maximum value and a value of the second number of bits that is obtained by adding zeros on the lower-bit side of a value that is smaller than the maximum value by one.

A data converting device according to a fourth aspect is the data converting device according to the first or second aspect, wherein when the value of first data pertaining to the present conversion is the maximum value and the value of first data pertaining to the last conversion is also the maximum value, the data converting means performs the present conversion such that the second data is set to the maximum value of the second data.

A data converting device according to a fifth aspect is the data converting device according to any of the first, second, or fourth aspect, wherein when the value of first data pertaining to the present conversion is the maximum value and the value of first data pertaining to the last conversion is also the maximum value and the value of first data pertaining to a second last conversion is not the maximum value, the data converting means performs the present conversion such that the second data is set to a value between the value of second data pertaining to the last conversion and the maximum value of the second data.

A data converting device according to a sixth aspect is the data converting device according to any of the first to fifth aspects, wherein when the value of first data pertaining to a next conversion is not the first maximum value, the second data converting means performs the present conversion such that the second data is set to a value between a value of the second number of bits that is obtained by adding zeros on the lower-bit side of the first maximum value and the second maximum value.

A data converting device according to a seventh aspect is the data converting device according to any of the first to sixth aspect, wherein when the value of first data pertaining to the present conversion is the maximum value and the value of first data pertaining to a next conversion is also the maximum value, the data converting means performs the present conversion such that the second data is set to the maximum value of the second data.

A data converting device according to an eighth aspect is the data converting device according to the third aspect, wherein when the value of first data pertaining to the present conversion is the maximum value and the value of first data pertaining to the last conversion is also the maximum value and the value of first data pertaining to the second last conversion is not the maximum value, the data converting means performs the present conversion such that the second data is set to a value between a value of the second number of bits that is obtained by adding zeros on the lower-bit side of the maximum value and the value of second data pertaining to the last conversion.

A data converting program according to a ninth aspect is a computer-readable program for carrying out a data converting method in a data converting device that includes data converting means for sequentially converting first data stored on a recording medium which is obtained by quantization with a first number of bits to second data extended to a second number of bits, the first data and the second data being able to assume respective maximum values thereof, wherein the program causes a computer to function as the data converting means that, when the value of the first data is the maximum value, converts the first data to the second data such that the second data is set to a value that takes into account the value of first data that precedes or succeeds the first data being converted.

A data converting method according to a tenth aspect is a data converting method for a data converting device that includes data converting means for sequentially converting first data obtained by quantization with a first number of bits to second data extended to a second number of bits, the first data and the second data being able to assume respective maximum values thereof, the method including a conversion step of, when the value of the first data is the maximum value, converting by the data converting means the first data to the second data such that the second data is set to a value that takes into account the value of first data that precedes or succeeds the first data being converted.

Effect of the Invention

According to the present invention, when the value of first data is the maximum value, the first data is converted to second data such that the second data is set to a value taking into account the value of first data that precedes or succeeds the first data being converted. Therefore, an error of the second data from the original analog signal can be minimized.

BRIEF DESCRIPTION OF THE DRAWINGS

FIG. 11 shows a general way of representing analog values as digital values;

FIG. 12 is a block diagram showing a configuration of a recording device for recording on a CD;

FIG. 13 is a block diagram showing a basic configuration of a reproducing device for reproducing audio recorded on a CD;

Figure 1:
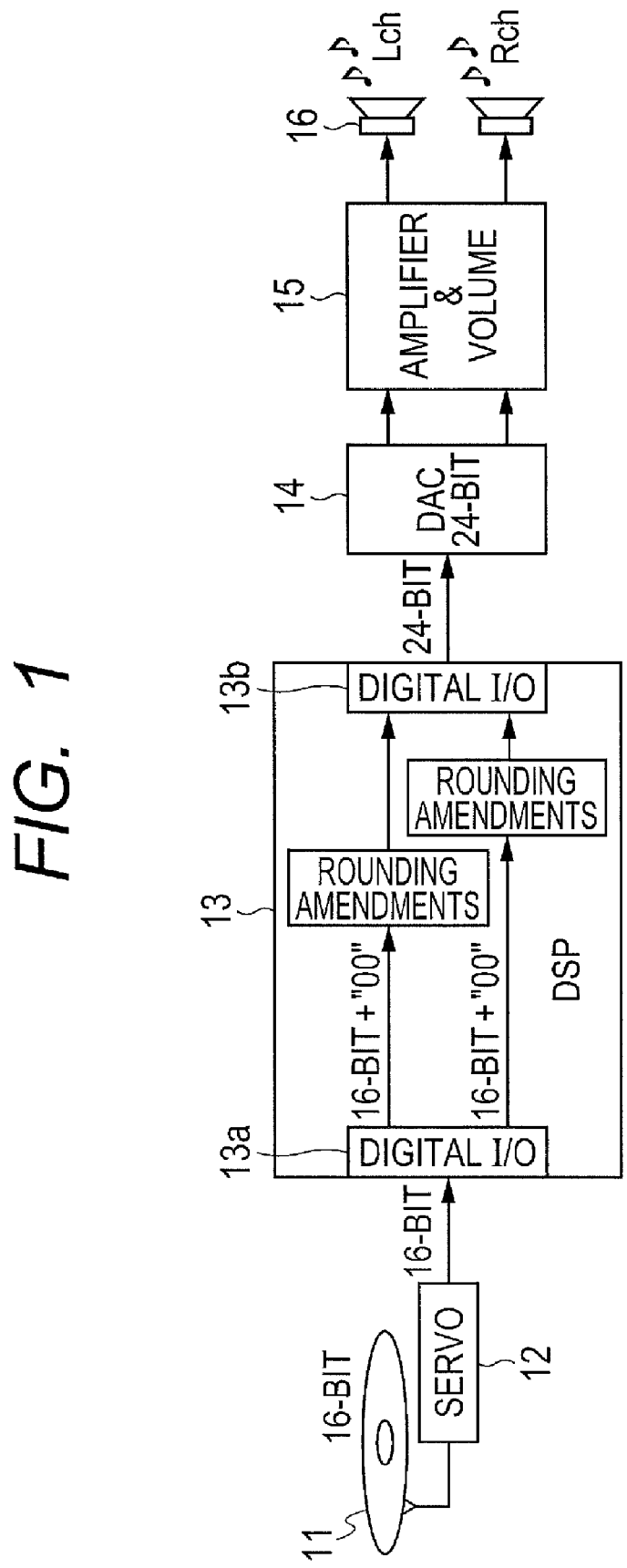
FIG. 1 is a block diagram showing a configuration of a reproducing device according to an embodiment of the present invention.

DESCRIPTION OF REFERENCES 11, 123, 133: CD
12, 134: servo mechanism
13: DSP
14, 135: D/A converter
15, 136: amplifier and volume
16, 137: loudspeaker
31, 71, 91: broken line representing input data
32, 72, 92: output data
121: A/D converter
122: writing means

BEST MODES FOR CARRYING OUT THE INVENTION

FIG. 1 is a block diagram showing a configuration of a reproducing device according to an embodiment of the present invention. As shown in the figure, the device includes a servo mechanism 12 for reading 16-bit data from a CD 11, a DSP 13 for converting 16-bit data read via the servo mechanism 12 to 24-bit data, a D/A converter 14 for converting 24-bit data from the DSP 13 to an analog signal, an amplifier and volume 15 for adjusting the amplitude and gain of the analog signal from the D/A converter 14, and a loudspeaker 16 for converting the audio signal from the amplifier and volume 15 to sound. The 16-bit data input to the DSP 13 includes signals for the left and right channels of a stereo, and signal processing from the D/A converter 14 up to the loudspeaker 16 is performed for each of the left- and right-channel signals.

When 16-bit data from the CD 11 which is input via a digital input/output unit 13a is not 0x7FFF (the positive maximum value of first data) or 0x8000 (the negative maximum value of the first data), the DSP 13 converts the data to 24-bit data by adding zeros on the lower-bit side of the data. When the 16-bit data from the CD 11 is 0x7FFF, the DSP 13 amends a rounding error by converting the 16-bit data to 24-bit data such that the 24-bit data is a value greater than 24-bit data that is obtained by adding zeros on the lower-bit side of the 16-bit data, taking into account the value of 16-bit data that precedes or succeeds the 16-bit data to be converted. When the 16-bit data from the CD 11 is 0x8000, the DSP 13 converts the 16-bit data to 24-bit data such that, taking into account the value of 16-bit data preceding or succeeding the 16-bit data, the 24-bit data is made by adding zeros on the lower-bit side of the 16-bit data, or such that data after conversion is a value between the value of the 24-bit data thus generated and 24-bit data which is obtained by adding zeros on the lower-bit side of a value that is greater than 0x8000 by one. The resulting 24-bit data is output by way of a digital input/output unit 13b.

Figure 2:
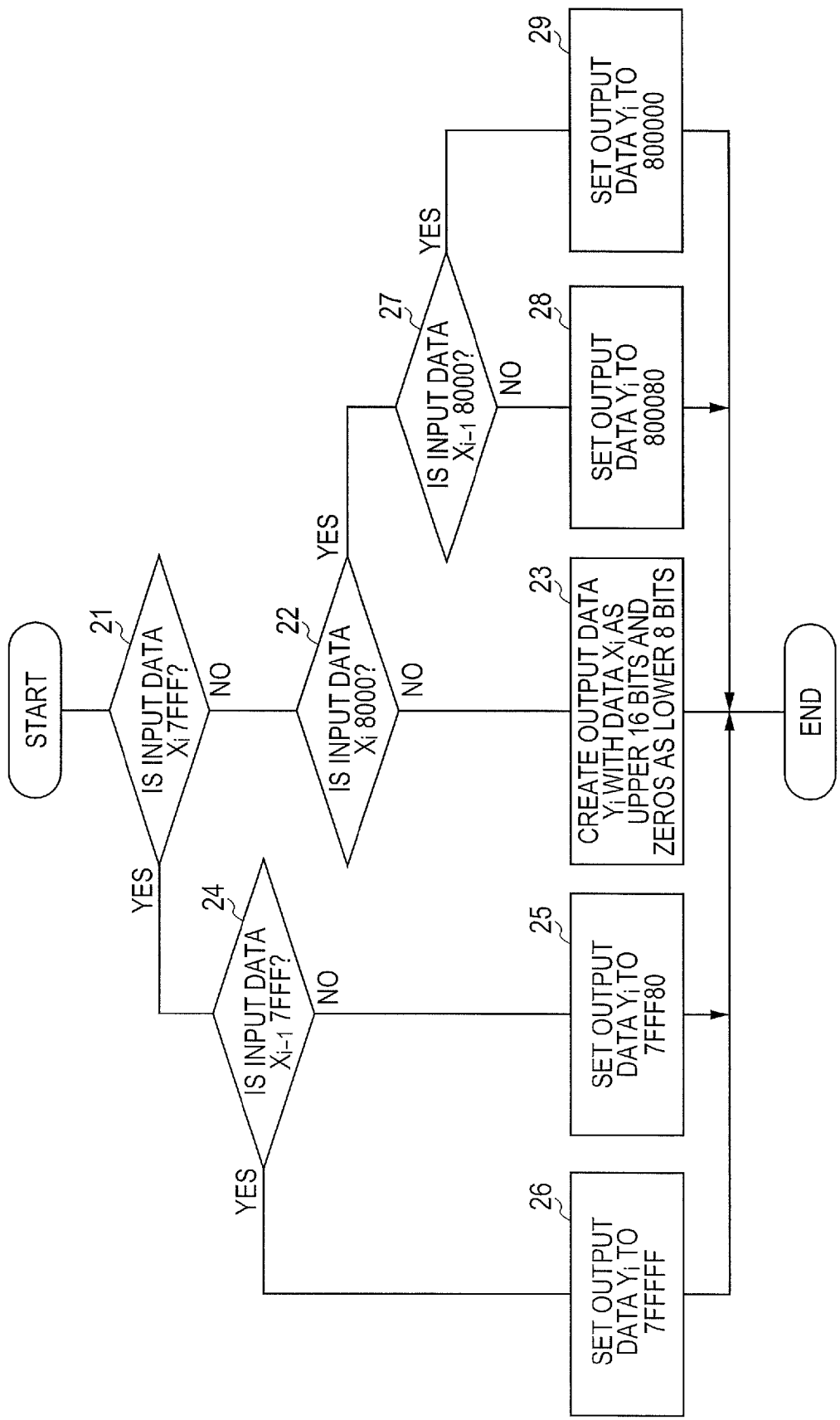
FIG. 2 is a flowchart illustrating a bit extension process in the device of FIG. 1.
Figure 3:
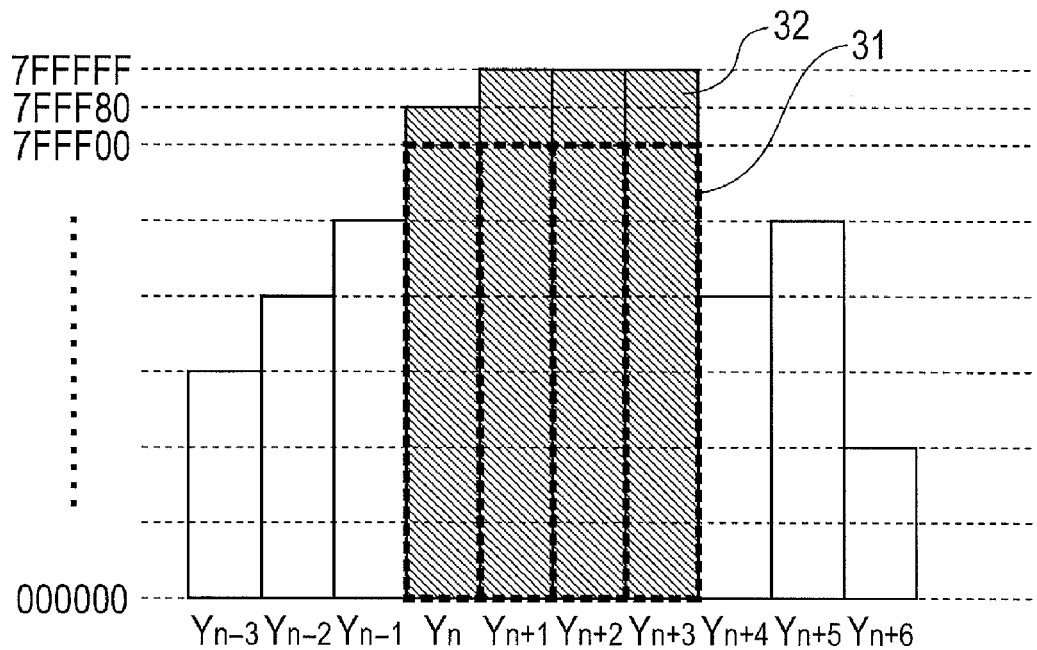
FIG. 3 illustrates a result of the bit extension process of FIG. 2.
Figure 4:
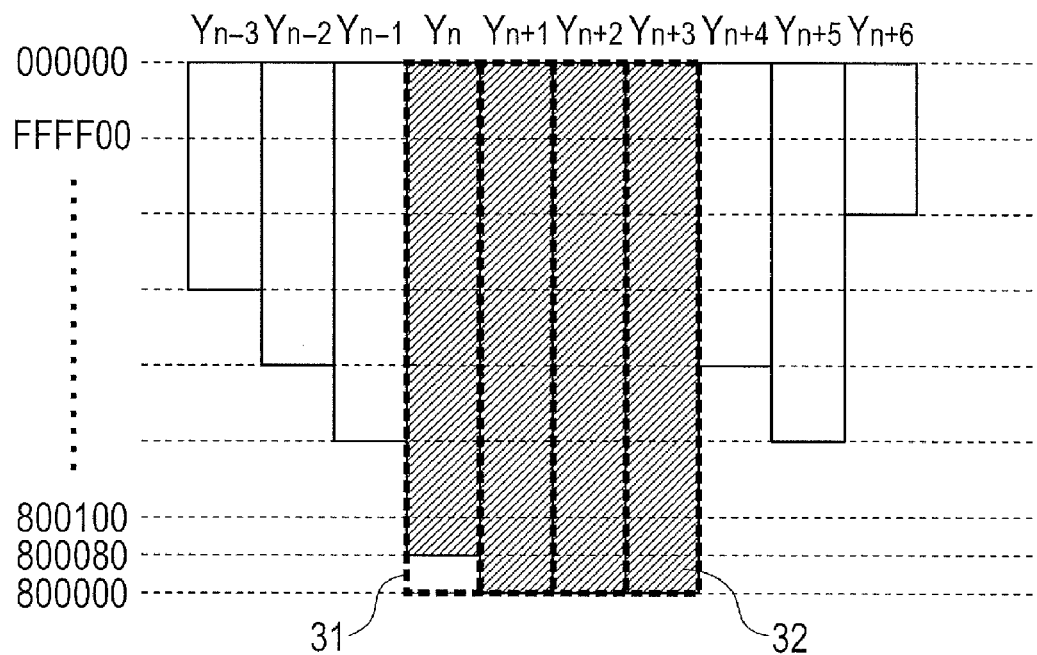
FIG. 4 further illustrates a result of the bit extension process of FIG. 2.

FIG. 2 is a flowchart illustrating a bit extension process performed in the DSP 13. In the figure, 16-bit data sequentially input from the CD 11 to the DSP 13 via the servo mechanism 12 is denoted as $X_i$ (i= . . . n−3, n−2, n−1, n, n+1, n+2, n+3, . . . ). Data $X_i$ is subjected to bit extension, and 24-bit data output from the DSP 13 is denoted as $Y_i$. The process of FIG. 2 is performed on each input of input data $X_i$. FIGS. 3 and 4 illustrate output data $Y_i$ which is output as a result of bit extension shown in FIG. 2 for data $Y_{n-3}$ to $Y_{n+6}$. The broken line denoted as 31 in the figures represents input data $X_n$ to $X_{n+3}$ (=0x7FFF, 0x8000) that correspond to output data 32 ($Y_n$ to $Y_{n+3}$) in the hatched portion. Bit extension in this portion is different from that of conventional art.

When the bit extension process of FIG. 2 is started, the DSP 13 first determines at step 21 whether or not input data $X_i$ is 0x7FFF. If it determines that input data $X_i$ is not 0x7FFF, the flow proceeds to step 22, where the DSP 13 determines whether or not data $X_i$ is 0x8000. If it determines that data $X_i$ is not 0x8000, the flow proceeds to step 23, where the DSP 13 creates 24-bit data as output data $Y_i$ with the input data $X_i$ as the upper 16 bits and zeros as the lower 8 bits as conventionally done, and terminates processing. The output data $Y_i$ in this case corresponds to $Y_{n-3}$ to $Y_{n-1}$ and $Y_{n+4}$ to $Y_{n+6}$ in FIGS. 3 and 4, for example.

If the DSP 13 determines that input data $X_i$ is 0x7FFF at step 21, the flow proceeds to step 24, where the DSP 13 determines whether or not input data $X_{i-1}$ is 0x7FFF. If it determines that the data is not 0x7FFF, the flow proceeds to step 25, where 24-bit output data $Y_i$ is set to 0x7FFF80 and the process of FIG. 2 is terminated. The output data $Y_i$ in this case corresponds to $Y_n$ in FIG. 3, for example. That is to say, output data $Y_n$ for input data $X_n$ (=0x7FFF) according to conventional art is 0x7FFF00, which is obtained by adding 8-bit zeros on the lower-bit side, whereas the output data $Y_n$ according to the present embodiment is an intermediate value between 0xFFFFFF, i.e., the maximum value that can be represented in 24 bits, and 0x7FFF00.

If it is determined at step 24 that input data $X_{i-1}$ is 0x7FFF, output data $Y_i$ is set to 0x7FFFFF at step 26 and the process of FIG. 2 is terminated. The output data $Y_i$ in this case corresponds to $Y_{n+1}$ to $Y_{n+3}$ in FIG. 3, for example. That is to say, output data $Y_{n+1}$ to $Y_{n+3}$ for input data $X_{n+1}$ to $X_{n+3}$ (=0x7FFF) according to conventional art are 0x7FFF00, which is obtained by adding 8-bit zeros on the lower-bit side. In accordance with the present embodiment, however, input audio is assumed to have been clipped because 0x7FFF occurs two or more times in succession as input data $X_i$, and 0xFFFFFF which is the maximum value that can be represented in 24 bits is output as output data $Y_i$.

If it is determined at step 22 that input data $X_i$ is 0x8000, the flow proceeds to step 27, where it is determined whether or not input data $X_{i-1}$ is 0x8000. If it is determined that input data $X_{i-1}$ is not 0x8000, it is assumed that clipping is just to occur and the flow proceeds to step 28, where 24-bit output data $Y_i$ is set to 0x800080 and the process of FIG. 2 is terminated. The output data $Y_i$ in this case corresponds to $Y_n$ in FIG.

4, for example. That is to say, while output data $Y_n$ for input data $X_n$ (=0x8000) according to conventional art is 0x800000 which is obtained by adding 8-bit zeros on the lower-bit side, the present embodiment adopts 0x800080, which is a 24-bit value intermediate between 0x8000 and the next value, 0x8001.

If it is determined at step 27 that input data $X_{i-1}$ is 0x8000, input audio is assumed to have been clipped because 0x8000 occurs two or more times in succession. The flow then proceeds to step 29, where output data $Y_i$ is set to 0x800000, i.e., the minimum value that can be represented in 24 bits (the negative maximum value of the second data), and the process of FIG. 2 is terminated. The output data $Y_i$ in this case corresponds to $Y_{n+1}$ to $Y_{n+3}$ in FIG. 4, for example.

According to the present embodiment, because up to the maximum value that can be represented in 24 bits is used when applying bit extension to input data 0x7FFF, an error from the original analog value represented by input data 0x7FFF can be made smaller. That is to say, for input data $X_i$ having the value of 0x7FFF, output data $Y_i$ according to conventional art is 0x7FFF00 and there is no change in rounding error with respect to the original value. On the other hand, the present embodiment sets the output data $Y_i$ to 0x7FFF80 or 0x7FFFFF, which is considered to be closer to the original value, taking into account the values of input data $X_i$ and $X_{i-1}$, so a rounding error from the original value can be decreased. In other words, bit extension can be performed with higher accuracy.

In addition, while the positive side of value range after bit extension is up to 0x7FFF00 in conventional art, the present embodiment can use up to 0x7FFFFF on the positive side. In other words, dynamic range for non-clipped audio can be expanded.

Figure 5:
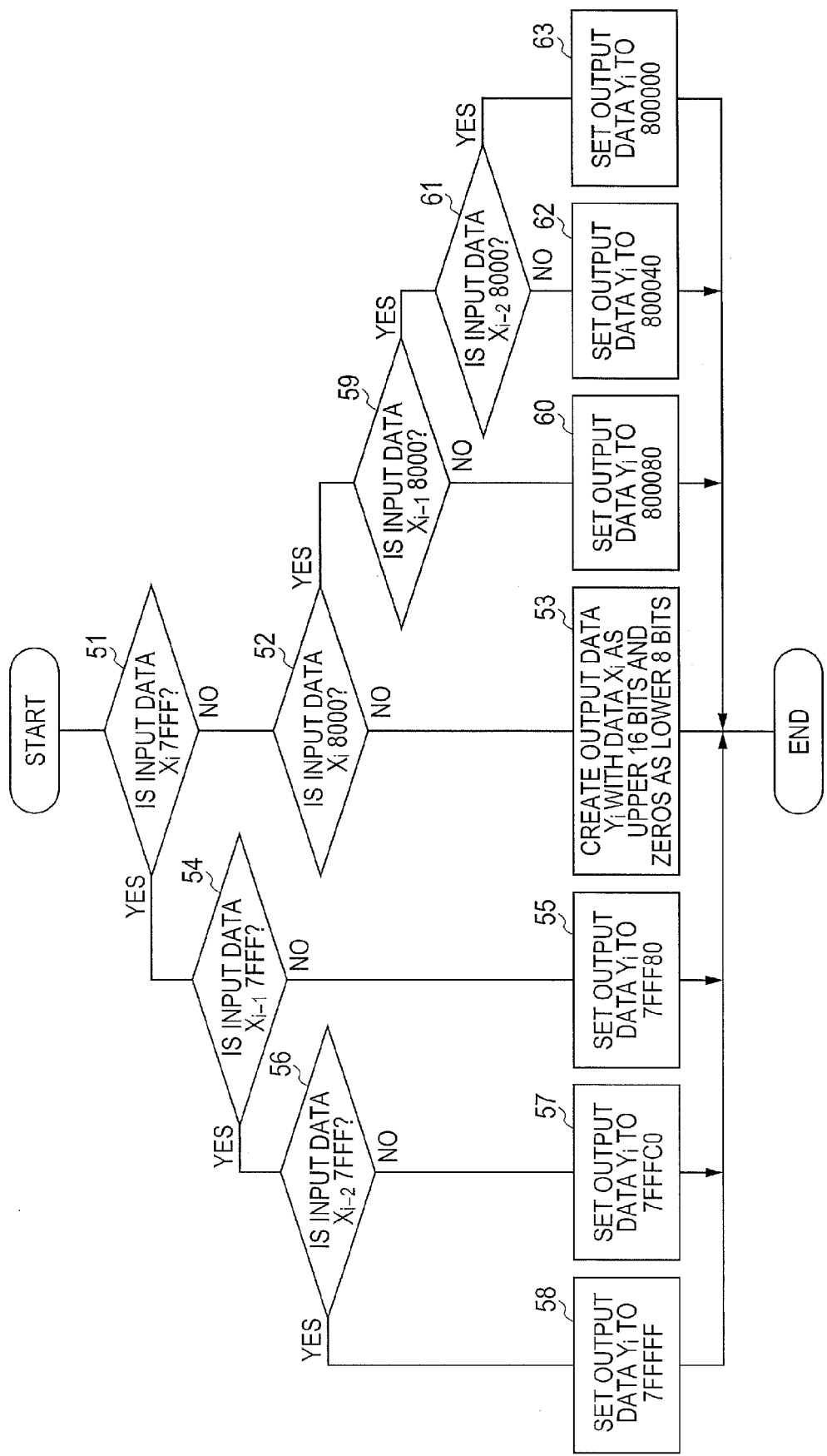
FIG. 5 is a flowchart illustrating another example of a bit extension process in the device of FIG. 1.
Figure 6:
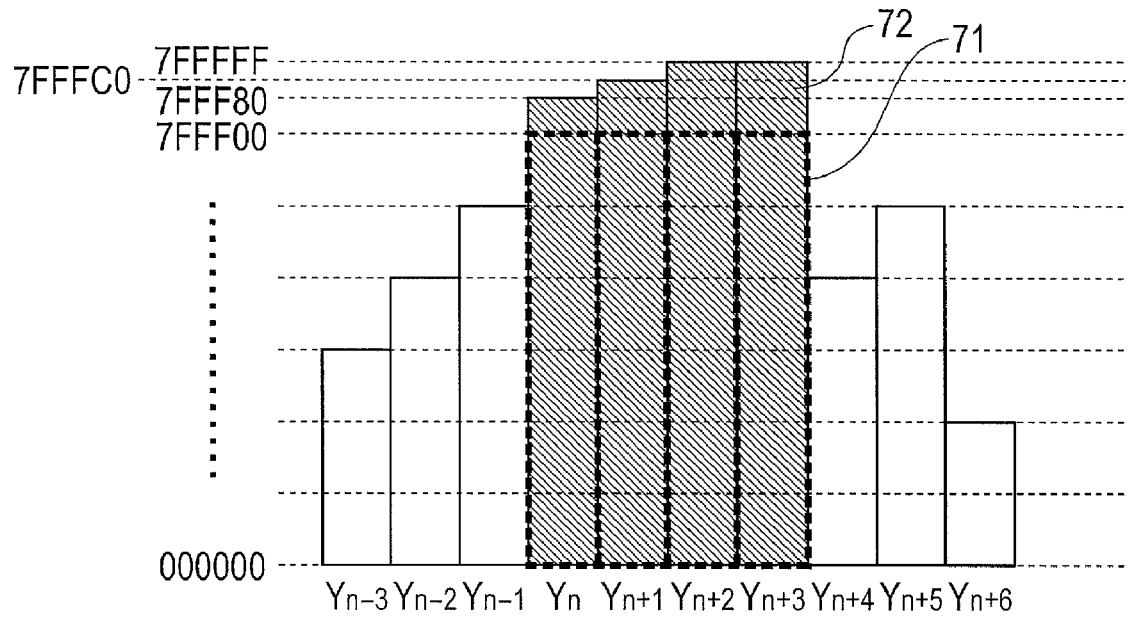
FIG. 6 illustrates a result of the bit extension process of FIG. 5.
Figure 7:
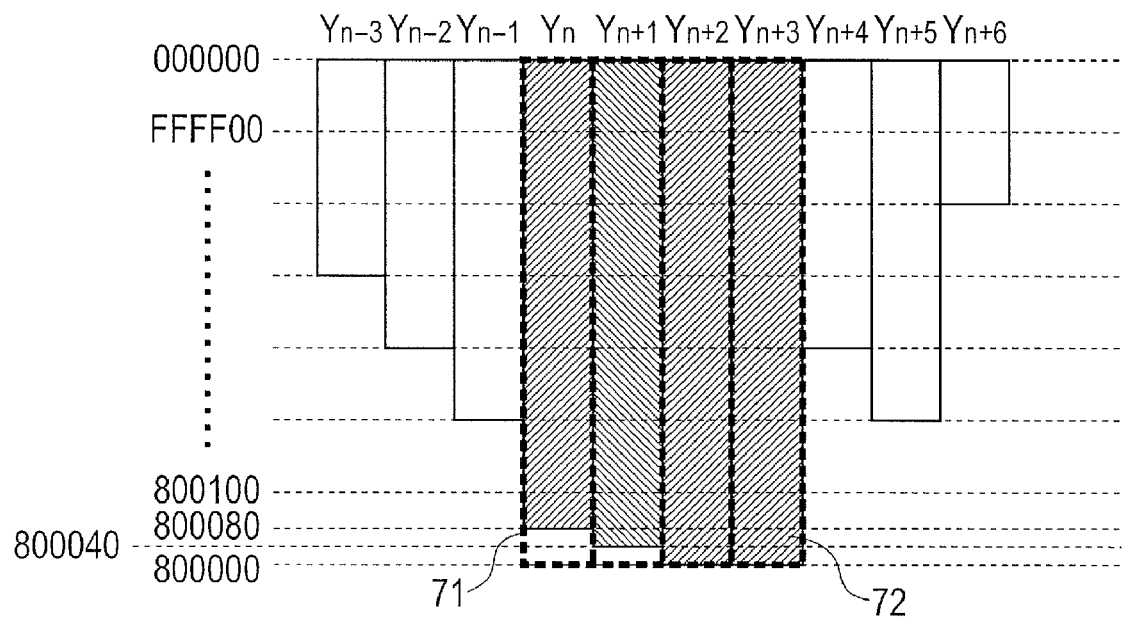
FIG. 7 further illustrates a result of the bit extension process of FIG. 5.

FIG. 5 is a flowchart illustrating another example of bit extension in the DSP 13. This process is also performed on each input of 16-bit data $X_i$ to output 24-bit expanded data $Y_i$. FIGS. 6 and 7 illustrate output data $Y_i$ which is output as a result of the bit extension of FIG. 5 for $Y_{n-3}$ through $Y_{n+6}$. The broken line denoted as 71 in the figures represents input data $X_n$ to $X_{n+3}$ (=0x7FFF, 0x8000) that correspond to output data 72 ($Y_n$ to $Y_{n+3}$) in the hatched portion. Bit extension in this portion is different from that of conventional art.

In the process of FIG. 5, processing at steps 51 to 55, 59, and 60 is the same as those performed at steps 21 to 25, 27, and 28 in FIG. 2. On the other hand, if it is determined at step 54 that input data $X_{i-1}$ is 0x7FFF, the flow proceeds to step 56, where it is determined whether or not input data $X_{i-2}$ is 0x7FFF. If it is determined that input data $X_{i-2}$ is not 0x7FFF, it is assumed that clipping is just to occur, and output data $Y_i$ is set to 0x7FFFC0 at step 57 and the process of FIG. 5 is terminated. The output data $Y_i$ in this case corresponds to $Y_{n+1}$ in FIG. 6, for example. That is to say, in this process, a condition for determining that clipping has occurred is stricter than in the process of FIG. 2.

If it is determined that input data $X_{i-2}$ is 0x7FFF at step 56, input audio is assumed to have been clipped, and the output data $Y_i$ is set to 0x7FFFFF at step 58, and the process of FIG. 2 is terminated. The output data $Y_i$ in this case corresponds to $Y_{n+2}$ and $Y_{n+3}$ in FIG. 6, for example. That is to say, this embodiment considers that input audio has been clipped when 0x7FFF occurs as input data $X_i$ three times or more in succession.

On the other hand, if it is determined at step that the input data is 0x8000, the flow proceeds to step 61, where it is determined whether or not input data $X_{i-2}$ is 0x8000. If it is determined that the data $X_{i-2}$ is not 0x8000, it is assumed that clipping is just to occur and output data $Y_i$ is set to 0x800040 at step 62, and the process of FIG. 5 is terminated. The output data $Y_i$ in this case corresponds to $Y_{n+1}$ in FIG. 7, for example. That is to say, again, the condition for determining that clipping has occurred is stricter than in the process of FIG. 2.

If it is determined that input data $X_{i-2}$ is 0x8000 at step 61, input audio is assumed to have been clipped, and the output data $Y_i$ is set to 0x800000 at step 63 and the process of FIG. 5 is terminated. The output data $Y_i$ in this case corresponds to $Y_{n+2}$ and $Y_{n+3}$ in FIG. 7, for example. That is to say, also in this case, it is considered that input audio has been clipped when 0x8000 occurs in succession three or more times as input data $X_i$.

The embodiment shown by FIGS. 5 to 7 also provides similar effects to those in FIGS. 2 to 4 and also defines finer steps before determining that clipping has occurred. Therefore, the embodiment can further decrease a rounding error from the original audio signal.

Figure 8:
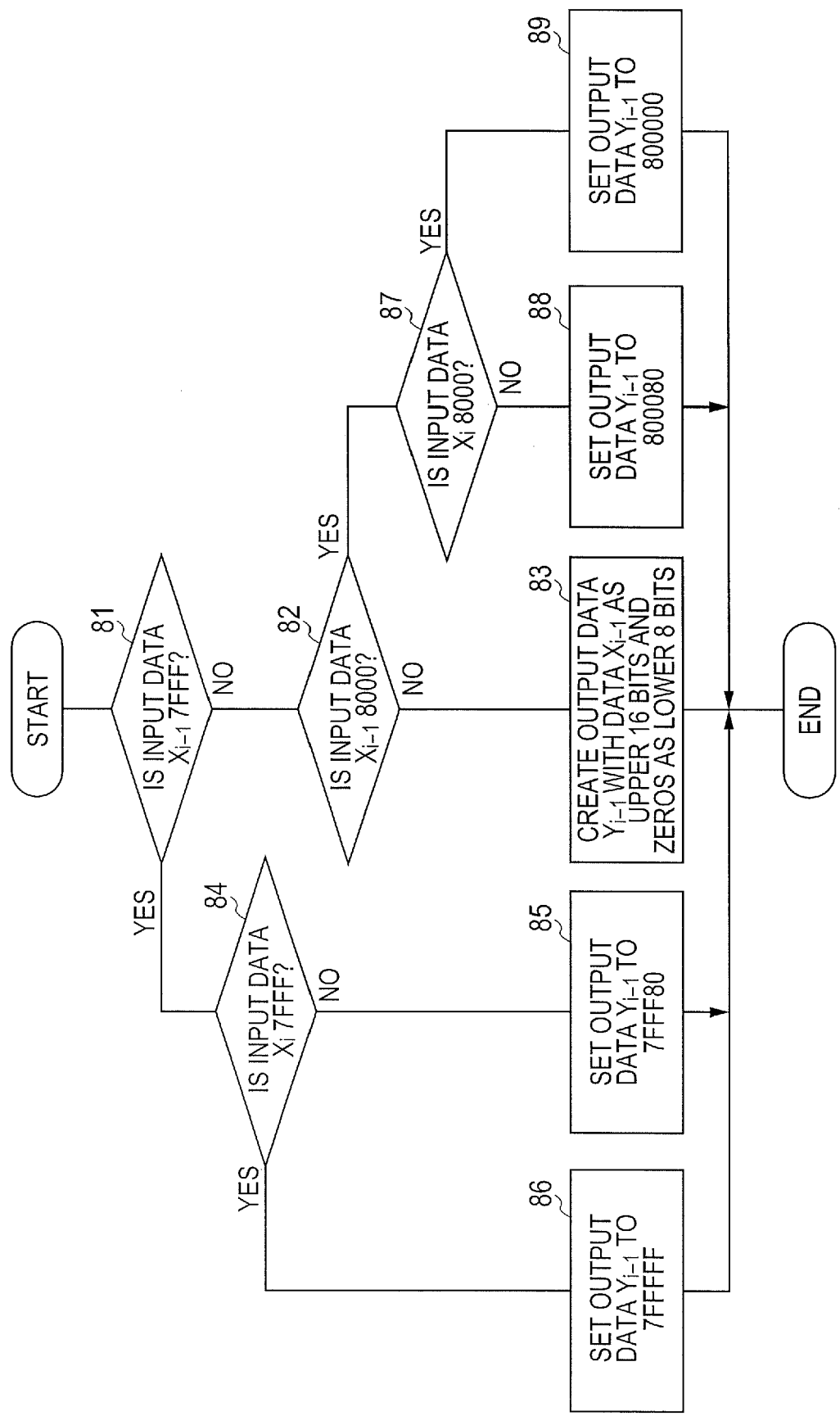
FIG. 8 is a flowchart illustrating another example of a bit extension process in the device of FIG. 1.
Figure 9:
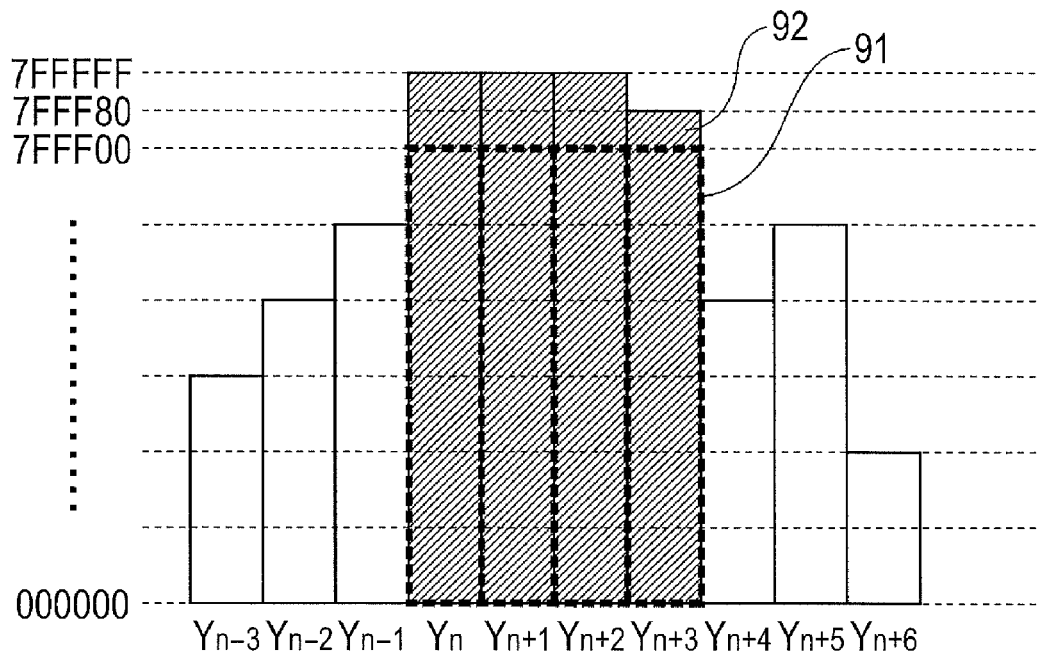
FIG. 9 illustrates a result of the bit extension process of FIG. 8.
Figure 10:
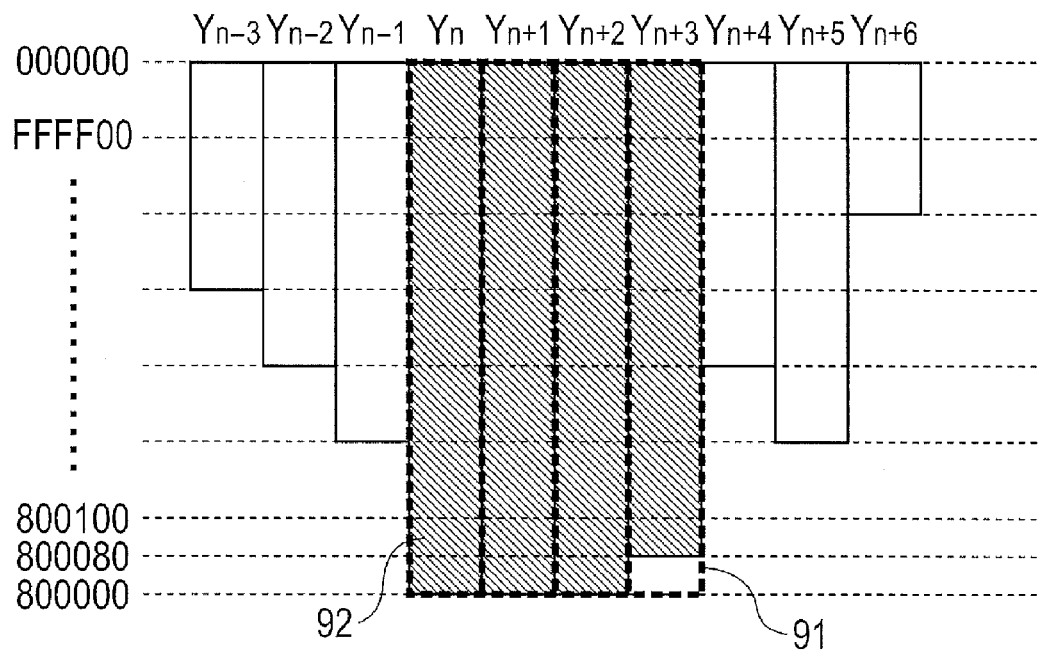
FIG. 10 further illustrates a result of the bit extension process of FIG. 8.
Figures 14, 15:
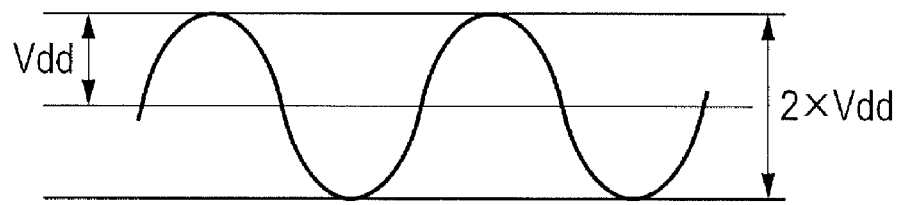
FIG. 14 shows how CD data is handled in a 24-bit DSP.
FIG. 15 illustrates maximum voltage $V_{dd}$ that can be input to the A/D converter of FIG. 12.

FIG. 8 is a flowchart illustrating yet another example of bit extension performed by the DSP 13. This process is performed on each input of 16-bit data $X_i$ to output 24-bit expanded data for each input. FIGS. 9 and 10 illustrate output data $Y_{i-1}$ output as a result of bit extension of FIG. 8 for $Y_{n-3}$ through $Y_{n+6}$. The broken line denoted as 91 in the figures represents input data $X_n$ to $X_{n+3}$ (=0x7FFF, 0x8000) that correspond to output data 92 ($Y_n$ to $Y_{n+3}$) in the hatched portion. Bit extension in this portion is different from that of conventional art.

When the bit extension process of FIG. 8 is started in response to input of data $X_i$, the DSP 13 first determines at step 81 whether or not the input data $X_{i-1}$ is 0x7FFF. If the DSP 13 determines that the input data is not 0x7FFF, the flow proceeds to step 82, where it is determined whether the input data $X_{i-1}$ is 0x8000. If it is determined that the data $X_{i-1}$ is not 0x8000, the flow proceeds to step 83, where 24-bit data generated with the input data $X_{i-1}$ as the upper 16 bits and zeros as the lower 8 bits is output as output data $Y_{i-1}$ and the process of FIG. 8 is terminated. The output data $Y_{i-1}$ in this case corresponds to $Y_{n-3}$ to $Y_{n-1}$ and $Y_{n+4}$ to $Y_{n+6}$ in FIGS. 9 and 10, for example.

If it is determined at step 81 that the input data $X_{i-1}$ is 0x7FFF, the flow proceeds to step 84, where it is determined whether or not input data $X_i$ is 0x7FFF. If it is determined that input data $X_i$ is not 0x7FFF, the flow proceeds to step 85, 24-bit output data is set to 0x7FFF80 and the process of FIG. 8 is terminated. The output data $Y_{i-1}$ in this case corresponds to $Y_{n+3}$ in FIG. 9, for example. That is to say, while output data $Y_{n+3}$ for input data $X_{n+3}$ (=0x7FFF) according to conventional art is 0x7FFF00 which is obtained by adding 8-bit zeros on the lower-bit side of input data $X_{n+3}$, the output data $Y_{n+3}$ according to the present embodiment is an intermediate value between 0xFFFFFF, i.e., the maximum value that can be represented in 24 bits, and 0x7FFF00.

If it is determined at step 84 that input data $X_i$ is 0x7FFF, output data $Y_{i-1}$ is set to 0x7FFFFF at step and the process of FIG. 8 is terminated. The output data $Y_{i-1}$ in this case corresponds to $Y_{i-1}$ to $Y_{n+2}$ in FIG. 9, for example. That is to say, output data $Y_n$ to $Y_{n+2}$ for input data $X_n$ to $X_{n+2}$ (=0x7FFF) according to conventional art are 0x7FFF00, which is obtained by adding 8-bit zeros on the lower-bit side of input data $X_n$ to $X_{n+2}$. In accordance with the present embodiment, however, because input of 0x7FFF occurs two or more times in succession before input data $X_i$, it is assumed that clipping of input audio is still going on, and 0xFFFFFF, which is the maximum value that can be represented in 24 bits, is output as output data $Y_{i-1}$.

If it is determined at step 82 that input data $X_{i-1}$ is 0x8000, the flow proceeds to step 87, where it is determined whether or not input data $X_i$ is 0x8000. If it is determined that input data $X_i$ is not 0x8000, it is assumed that clipping has ended, and 24-bit output data is set to 0x800080 at step 88 and the process of FIG. 8 is terminated. The output data $Y_{i-1}$ in this case corresponds to $Y_{n+3}$ in FIG. 10, for example. That is to say, while output data $Y_{n+3}$ for input data $X_{n+3}$ (=0x8000) according to conventional art is 0x800000 which is obtained by adding 8-bit zeros on the lower-bit side of input data $X_{n+3}$, the present embodiment sets $Y_{n+3}$ to 0x800080 which is a 24-bit value intermediate between 0x8000 and the next value, 0x8001.

If it is determined at step 87 that input data $X_i$ is 0x8000, it is assumed that clipping of input audio is still going on because 0x8000 occurs two or more times in succession. At step 89, output data $Y_{n-1}$ is set to 0x800000, which is the minimum value that can be represented in 24 bits, and the process of FIG. 8 is terminated. The output data in this case corresponds to $Y_n$ to $Y_{n+2}$ in FIG. 10, for example.

According to the present embodiment, output data $Y_{i-1}$ is set to 0x7FFF80 or 0x7FFFFF, which is considered to be closer to the original value, taking into consideration the values of input data $X_i$ and $X_{i-1}$. Therefore, a rounding error from the original value can be made smaller and also variation in value of output data at the end of clipping can be smoothed. This embodiment also provides similar effects to those of the embodiments shown in FIGS. 2 to 5.

The present invention is not limited to the above-described embodiments and may be practiced with modification as appropriate. For example, as the embodiments illustrated in FIGS. 2 to 7 have the effect of smoothing the start of clipping and the embodiment in FIGS. 8 to 10 has the effect of smoothing the end of clipping, both embodiments may be combined to smooth both the start and end of clipping.

Additionally, while the above descriptions discuss use of 16-bit decoded data from a CD as data for conversion to 24-bit data, other data, e.g., 16-bit data generated by decoding compressed audio data in MP3 format, may be used instead.

The invention claimed is:

1. A data converting device comprising a data converting unit configured to sequentially convert first data obtained by quantization with a first number of bits to second data extended to a second number of bits, the first data and the second data being data that can assume respective maximum values thereof, wherein when a value of the first data is the maximum value, the data converting unit converts the first data to the second data such that the second data is set to a value that takes into account the value of first data that precedes or succeeds the first data being converted, wherein the second number of bits is greater than the first number of bits, wherein when the value of first data pertaining to a present conversion is the maximum value and the value of first data pertaining to a last conversion is not the maximum value, the data converting unit performs the present conversion such that the second data is set to a value between a value of the second number of bits that is obtained by adding zeros on a lower-bit side of the maximum value and the maximum value of the second data.

2. A data converting device comprising a data converting unit configured to sequentially convert first data obtained by quantization with a first number of bits to second data extended to a second number of bits, the first data and the second data being data that can assume respective maximum values thereof, wherein when a value of the first data is the maximum value, the data converting unit converts the first data to the second data such that the second data is set to a value that takes into account the value of first data that precedes or succeeds the first data being converted, wherein when the value of first data pertaining to the present conversion is the maximum value and the value of first data pertaining to the last conversion is not the maximum value, the data converting unit performs the present conversion such that the second data is set to a value between a value of the second number of bits that is obtained by adding zeros on the lower-bit side of the maximum value and a value of the second number of bits that is obtained by adding zeros on the lower-bit side of a value that is smaller than the maximum value by one.

3. The data converting device according to claim 1 or 2, wherein when the value of first data pertaining to the present conversion is the maximum value and the value of first data pertaining to the last conversion is also the maximum value, the data converting unit performs the present conversion such that the second data is set to the maximum value of the second data.

4. The data converting device according to claim 1 or 2, wherein when the value of first data pertaining to the present conversion is the maximum value and the value of first data pertaining to the last conversion is also the maximum value and the value of first data pertaining to a second last conversion is not the maximum value, the data converting unit performs the present conversion such that the second data is set to a value between the value of second data pertaining to the last conversion and the maximum value of the second data.

5. The data converting device according to any one of claims 1 to 2, wherein when the value of first data pertaining to the present conversion is the maximum value and the value of first data pertaining to a next conversion is also the maximum value, the data converting unit performs the present conversion such that the second data is set to the maximum value of the second data.

6. The data converting device according to any one of claims 1 to 2, wherein when the value of first data pertaining to the present conversion is the maximum value and the values of first data pertaining to the last and second last conversions are also the maximum values, the data converting unit performs the present conversion such that the second data is set to the maximum value of the second data.

7. The data converting device according to claim 2, wherein when the value of first data pertaining to the present conversion is the maximum value and the value of first data pertaining to the last conversion is also the maximum value and the value of first data pertaining to the second last conversion is not the maximum value, the data converting unit performs the present conversion such that the second data is set to a value between a value of the second number of bits that is obtained by adding zeros on the lower-bit side of the maximum value and the value of second data pertaining to the last conversion.

8. A data converting program stored on a non-transitory computer-readable medium for carrying out a data converting method in a data converting device that comprises a data converting unit configured to sequentially convert first data stored on a recording medium which is obtained by quantization with a first number of bits to second data extended to a second number of bits, the first data and the second data being able to assume respective maximum values thereof, wherein the program causes a computer to function as the data converting unit that, when the value of the first data is the maximum value, converts the first data to the second data such that the second data is set to a value that takes into account the value of first data that precedes or succeeds the first data being converted, wherein the second number of bits is greater than the first number of bits, wherein when the value of first data pertaining to a present conversion is the maximum value and the value of first data pertaining to a last conversion is not the maximum value, the data converting unit performs the present conversion such that the second data is set to a value between a value of the second number of bits that is obtained by adding zeros on a lower-bit side of the maximum value and the maximum value of the second data.

9. A data converting method for a data converting device that comprises a data converting unit configured to sequentially convert first data obtained by quantization with a first number of bits to second data extended to a second number of bits, the first data and the second data being able to assume respective maximum values thereof, comprising a conversion step of, when the value of the first data is the maximum value, converting by the data converting unit the first data to the second data such that the second data is set to a value that takes into account the value of first data that precedes or succeeds the first data being converted, wherein the second number of bits is greater than the first number of bits, wherein when the value of first data pertaining to the present conversion is the maximum value and the value of first data pertaining to the last conversion is not the maximum value, the data converting unit performs the present conversion such that the second data is set to a value between a value of the second number of bits that is obtained by adding zeros on the lower-bit side of the maximum value and a value of the second number of bits that is obtained by adding zeros on the lower-bit side of a value that is smaller than the maximum value by one.

10. A data converting method in a data converting device that comprises a data converting unit configured to sequentially convert first data stored on a recording medium which is obtained by quantization with a first number of bits to second data extended to a second number of bits, the first data and the second data being able to assume respective maximum values thereof, wherein the program causes a computer to function as the data converting unit that, when the value of the first data is the maximum value, converts the first data to the second data such that the second data is set to a value that takes into account the value of first data that precedes or succeeds the first data being converted, wherein the second number of bits is greater than the first number of bits, wherein when the value of first data pertaining to a present conversion is the maximum value and the value of first data pertaining to a last conversion is not the maximum value, the data converting unit performs the present conversion such that the second data is set to a value between a value of the second number of bits that is obtained by adding zeros on a lower-bit side of the maximum value and the maximum value of the second data.

11. A data converting method for a data converting device that comprises a data converting unit configured to sequentially convert first data obtained by quantization with a first number of bits to second data extended to a second number of bits, the first data and the second data being able to assume respective maximum values thereof, comprising a conversion step of, when the value of the first data is the maximum value, converting by the data converting unit the first data to the second data such that the second data is set to a value that takes into account the value of first data that precedes or succeeds the first data being converted, wherein the second number of bits is greater than the first number of bits, wherein when the value of first data pertaining to the present conversion is the maximum value and the value of first data pertaining to the last conversion is not the maximum value, the data converting unit performs the present conversion such that the second data is set to a value between a value of the second number of bits that is obtained by adding zeros on the lower-bit side of the maximum value and a value of the second number of bits that is obtained by adding zeros on the lower-bit side of a value that is smaller than the maximum value by one.

* * * * *